United States Patent [19]

Torek

[11] Patent Number: 6,090,683
[45] Date of Patent: *Jul. 18, 2000

[54] METHOD OF ETCHING THERMALLY GROWN OXIDE SUBSTANTIALLY SELECTIVELY RELATIVE TO DEPOSITED OXIDE

[75] Inventor: Kevin J. Torek, Boise, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 08/877,527

[22] Filed: Jun. 16, 1997

[51] Int. Cl.[7] .......................... H01L 21/762; H01L 21/302
[52] U.S. Cl. .......................... 438/424; 438/692; 438/738; 438/743
[58] Field of Search ..................................... 438/424, 700, 438/723, 692, 738, 743, FOR 131, FOR 227, FOR 398; 148/DIG. 50, DIG. 85, DIG. 86

[56] References Cited

U.S. PATENT DOCUMENTS

| | | |
|---|---|---|
| 4,127,437 | 11/1978 | Bersin et al. . |
| 4,749,440 | 6/1988 | Blackwood et al. . |
| 5,022,961 | 6/1991 | Izumi et al. . |
| 5,234,540 | 8/1993 | Grant et al. . |
| 5,316,965 | 5/1994 | Philipossian et al. . |
| 5,376,233 | 12/1994 | Man . |
| 5,438,012 | 8/1995 | Kamiyama . |
| 5,571,375 | 11/1996 | Izumi et al. . |
| 5,721,173 | 2/1998 | Yano et al. . |
| 5,728,621 | 3/1998 | Zheng et al. . |
| 5,731,241 | 3/1998 | Jang et al. . |
| 5,763,315 | 6/1998 | Benedict et al. . |
| 5,783,495 | 7/1998 | Li et al. . |
| 5,795,811 | 8/1998 | Kim et al. . |
| 5,858,858 | 1/1999 | Park et al. . |

OTHER PUBLICATIONS

Wolf, S., et al, "Silicon Processing for the VLSI Era: vol. 1, Process Technology", Lattice Press, pp. 533,534,555, 1986.

Jensen et al., *BPSG to Thermal Oxide Etch Selectively for Contact Clean Applications*, Technical Report DC/DE, Jan. 29, 1991, 9 pages.

Chen, C., et al., "A Novel 0.25 μm Shallow Trench Isolation Technology", United Microelectronics Corp. Advanced Technology Development Dept., Taiwan, R.O.C.; 4 pages (undated) (date unknown).

*Primary Examiner*—George Fourson
*Attorney, Agent, or Firm*—Wells, St. John, Roberts, Gregory & Matkin P.S.

[57] ABSTRACT

The invention comprises processing deposited oxide and grown oxide materials. In one implementation, a substrate is provided to have outwardly exposed grown oxide material and having deposited oxide material. The grown oxide material is etched substantially selective relative to the deposited oxide material. In another considered aspect, a silicon surface is thermally oxidized to form substantially undoped silicon dioxide over a substrate. A substantially undoped silicon dioxide layer is chemical vapor deposited over the substrate, with at least some of the thermally grown silicon dioxide being outwardly exposed. The exposed thermally grown silicon dioxide layer is vapor etched substantially selective relative to the deposited silicon dioxide layer using an etch chemistry comprising substantially anhydrous HF and an organic primer.

43 Claims, 3 Drawing Sheets

METHOD OF ETCHING THERMALLY GROWN OXIDE SUBSTANTIALLY SELECTIVELY RELATIVE TO DEPOSITED OXIDE

TECHNICAL FIELD

This invention relates to semiconductor processing methods, including, for example, methods of preparing a silicon wafer for fabrication of integrated circuitry.

BACKGROUND OF THE INVENTION

Integrated circuitry is typically fabricated on and within semiconductor substrates, such a bulk monocrystalline silicon wafers. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Electrical components fabricated on substrates, and particularly bulk semiconductor wafers, are isolated from adjacent devices by insulating materials, such as insulating oxides. One isolation technique uses shallow trench isolation, whereby trenches are cut into a substrate and are subsequently filled with insulating oxide, such as undoped silicon dioxide deposited by plasma-enhanced decomposition of tetraethylorthosilicate (PETEOS). In the context of this document, "substantially undoped" means a layer having a dopant concentration which is less than or equal to $10^{18}$ atoms/cm$^3$. The insulating material is typically planarized back to define isolated trenches filled with oxide. Subsequently, a previously formed pad oxide layer is removed from over the substrate to expose silicon for processing. Unfortunately, removal of the pad oxide also etches the TEOS deposited oxide and can undesirably form "keyholes" in the shallow trench isolation oxide.

Although the invention spawned primarily out of these concerns, the artisan will appreciate applicability of the following invention in other areas of semiconductor processing.

SUMMARY OF INVENTION

The invention comprises processing deposited oxide and grown oxide materials. In one implementation, a substrate is provided to have outwardly exposed grown oxide material and having deposited oxide material. The grown oxide material is etched substantially selective relative to the deposited oxide material. In another considered aspect, a silicon surface is thermally oxidized to form substantially undoped silicon dioxide over a substrate. A substantially undoped silicon dioxide layer is chemical vapor deposited over the substrate, with at least some of the thermally grown silicon dioxide being outwardly exposed. The exposed thermally grown silicon dioxide layer is vapor etched substantially selective relative to the deposited silicon dioxide layer using an etch chemistry comprising substantially anhydrous HF and an organic primer.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
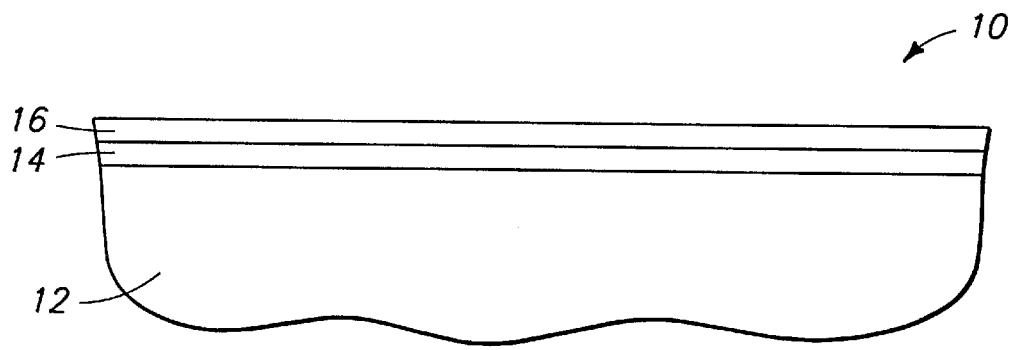
FIG. 1 is a sectional view of a semiconductor wafer fragment at one processing step in accordance with the invention.

The discussion proceeds initially with reference to FIGS. 1–6 for a first-described embodiment of the invention. FIG. 1 illustrates a semiconductor wafer fragment 10 comprised of a bulk monocrystalline silicon substrate 12. An oxide layer 14, such as silicon dioxide, is formed over bulk silicon wafer 12 to form a pad/protection oxide layer. Such could be formed by any technique, such as thermally oxidizing the outer silicon surface of substrate 12 in a steam ambient at 800° C.–1150° C. for 1–120 minutes to form a substantially undoped silicon dioxide layer 14 to a thickness of 40–200 Angstroms. A silicon nitride layer 16 is formed over thermal silicon dioxide layer 14, for example by chemical vapor deposition. Such will principally serve as an etch or polishing stop layer as will be apparent subsequently.

Figure 2:
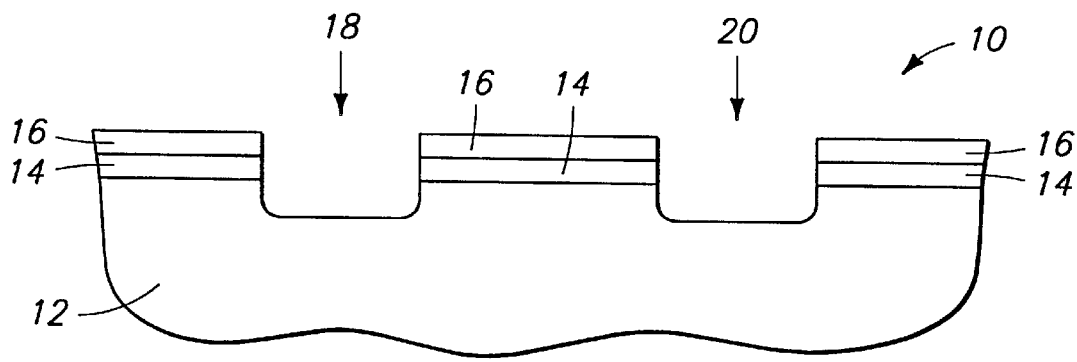
FIG. 2 is a view of the FIG. 1 wafer at a processing step subsequent to that shown by FIG. 1.

Referring to FIG. 2, a series of circuitry isolation trenches 18 and 20 are formed through silicon nitride layer 16, thermal silicon dioxide layer 14 and within bulk silicon wafer 12.

Figure 3:
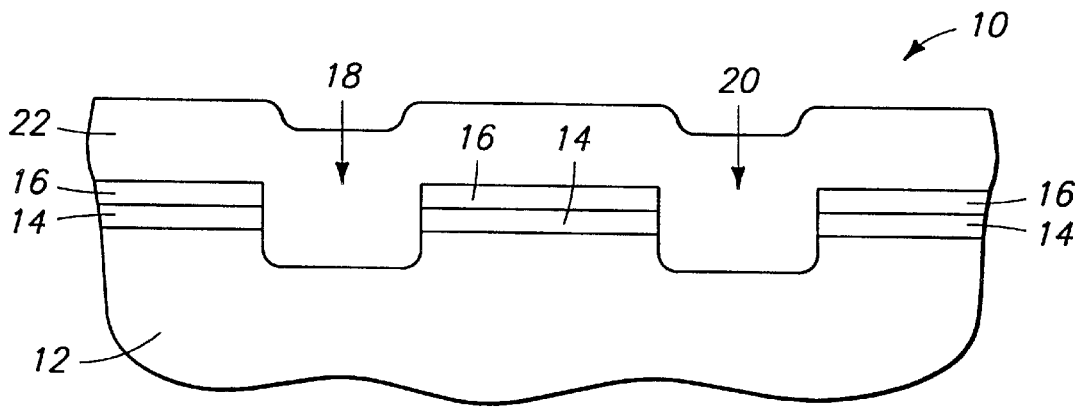
FIG. 3 is a view of the FIG. 1 wafer at a processing step subsequent to that shown by FIG. 2.

Referring to FIG. 3, a deposited oxide material 22 is formed over wafer 10 to fill circuitry isolation trenches 18 and 20. Layer 22 preferably comprises a substantially undoped silicon dioxide provided by plasma enhanced chemical vapor deposition from decomposition of tetraethylorthosilicate. Thus, ideally both material 22 and layer 14 are substantially undoped. Further in this embodiment, the thermally grown oxide is provided before the deposited oxide, with the thermally grown oxide also being provided before formation of the circuitry isolation trenches.

Figure 4:
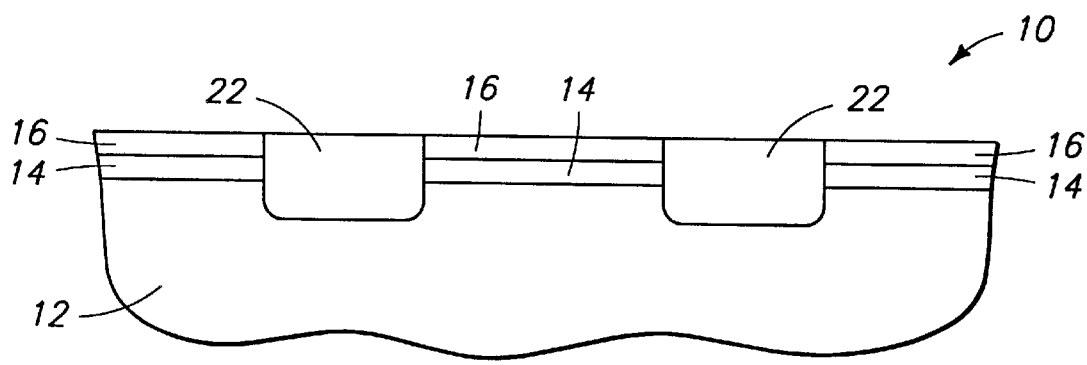
FIG. 4 is a view of the FIG. 1 wafer at a processing step subsequent to that shown by FIG. 3.

Referring to FIG. 4, deposited silicon dioxide layer 22 is planarized polished, such as by chemical-mechanical polishing, in a manner which is substantially selective relative to silicon nitride layer 16, with layer 16 thus forming an etch stop layer. This provides but one example of removing deposited oxide from outwardly of trenches 18 and 20, and providing a thermally grown oxide layer over the substrate outwardly of the trenches.

Figure 5:
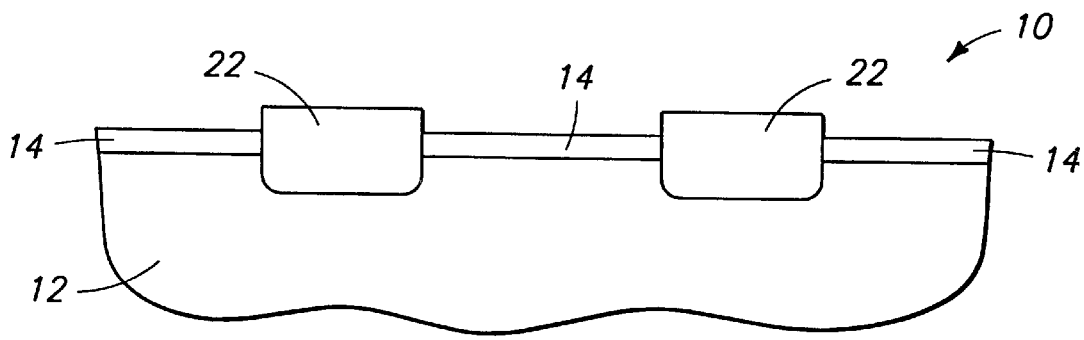
FIG. 5 is a view of the FIG. 1 wafer at a processing step subsequent to that shown by FIG. 4.

Referring to FIG. 5, silicon nitride layer 16 is etched substantially selective relative to thermal silicon dioxide layer 14 and deposited silicon dioxide layer 22, leaving outwardly exposed substantially undoped deposited silicon dioxide and outwardly exposed thermal silicon dioxide. An example chemistry would include a wet $H_3PO_4$ etch.

Figure 6:
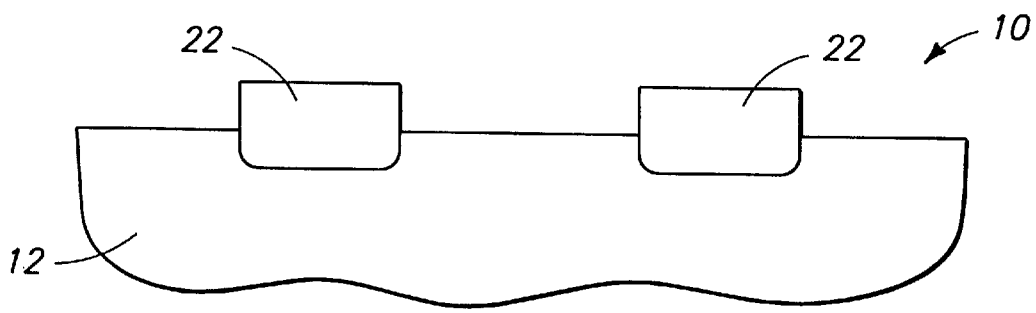
FIG. 6 is a view of the FIG. 1 wafer at a processing step subsequent to that shown by FIG. 5.

Referring to FIG. 6, the exposed thermally grown oxide material 14 is etched substantially selective relative to the exposed deposited oxide 22. Thus in this embodiment, the deposited oxide material is outwardly exposed at commencing of the etching of the grown oxide material substantially selective relative to the deposited oxide material.

The preferred etching is vapor etching, which also etches the thermal oxide substantially selective relative to underlying silicon, using an etch chemistry comprising substantially anhydrous HF and an organic primer. In the context of this document, "substantially anhydrous" means having no greater than 10% water by volume of the HF fraction of the etching chemistry. Most preferably, the substantially anhydrous HF fraction has less than or equal to 0.1% water by volume. Preferred organic primers include alcohols and ketones and mixtures thereof, with methanol being but one example. A preferred temperature and pressure range during the vapor etching is from about 50° C. to about 150° C. and a pressure from about 10 Torr to about 300 Torr.

One reduction-to-practice example included anhydrous HF having less than 0.1% water at a flow rate of 180 sccm, and $N_2$ flow rate of 750 sccm, and $CH_3OH$ at 175 sccm. The temperature was 120° C. and pressure was 100 Torr. Selectivity in etch rate of the thermally grown silicon dioxide to the chemical vapor deposited silicon dioxide by PETEOS was approximately 171:1.

An alternate embodiment is described with reference to FIGS. 7–9. In the first described embodiment, the deposited oxide material was outwardly exposed along with the thermally grown oxide material at the point of commencing of the substantially selective etching of the grown oxide material. The FIGS. 7–9 embodiment provides but one example of a technique whereby the deposited oxide material is not outwardly exposed at the commencing of the selective etching of the grown oxide material. In this embodiment, like numerals are utilized from the first described embodiment, with differences being indicated with the suffix "a" or with different numerals.

Figure 7:
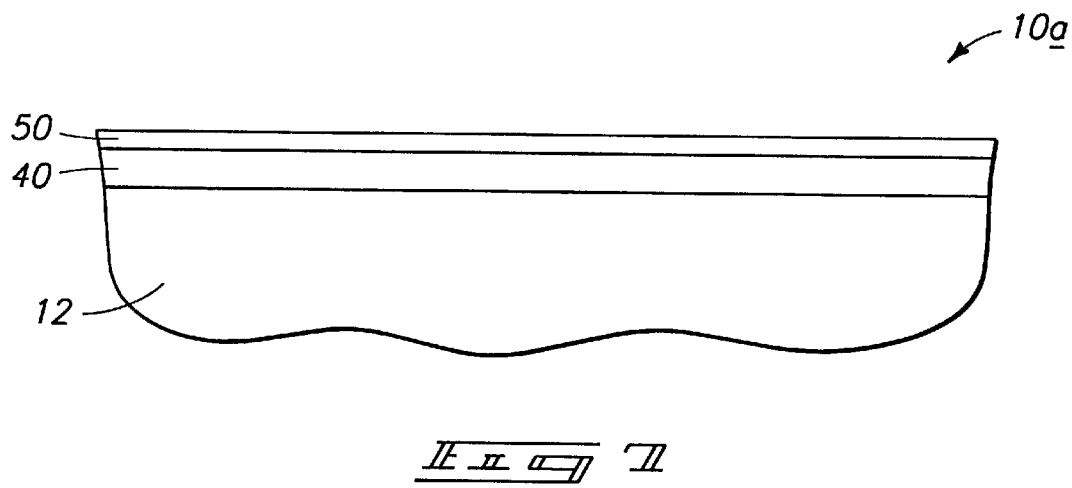
FIG. 7 is a sectional view of an alternate embodiment semiconductor wafer fragment at an alternate processing step in accordance with an aspect of the invention.

Referring to FIG. 7, a substantially undoped silicon dioxide layer 40 is deposited over a substrate 12 of the illustrated wafer fragment 10a. The preferred technique is as described above utilizing PETEOS. A layer 50 of substantially undoped silicon is deposited onto silicon dioxide layer 40. Layer 50 comprises, for example, polysilicon chemical vapor deposited using a silane as a source gas.

Figure 8:
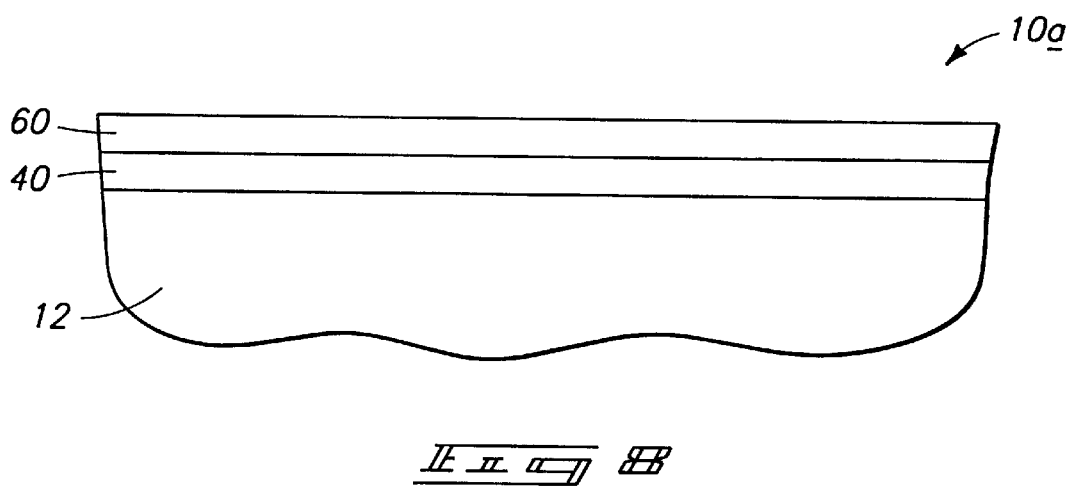
FIG. 8 is a view of the FIG. 7 wafer at a processing step subsequent to that shown by FIG. 8.

Referring to FIG. 8, silicon layer 50 is thermally oxidized, preferably in an $H_2O$ ambient, to form a thermal silicon dioxide layer 60 on deposited silicon dioxide layer 40.

Figure 9:
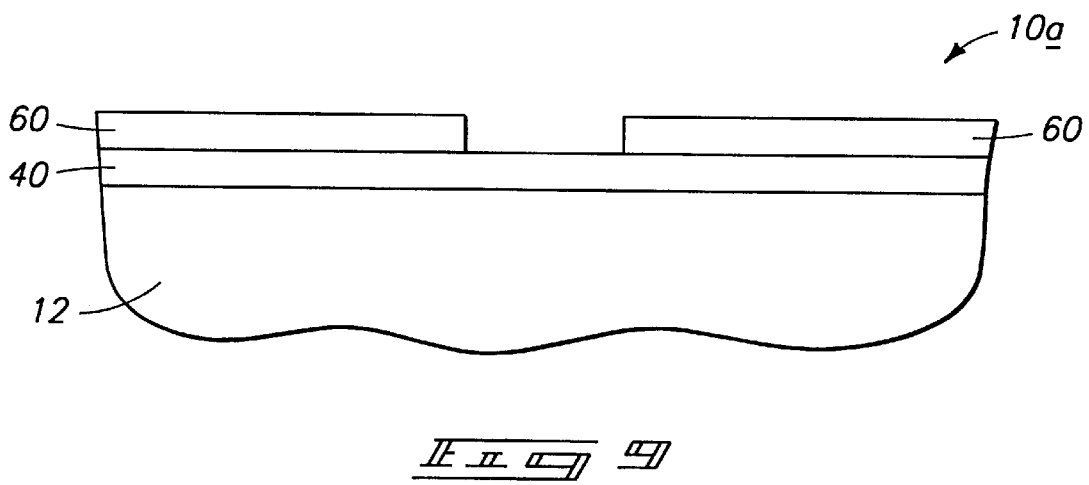
FIG. 9 is a view of the FIG. 7 wafer at a processing step subsequent to that shown by FIG. 8.

Referring to FIG. 9, a photoresist layer can be deposited and patterned (not shown) to outwardly expose only or at least a portion of thermally grown silicon dioxide layer 60. Subsequently, the exposed portion of thermal silicon dioxide layer 60 is etched substantially selective relative to deposited silicon dioxide layer 40 using an etch chemistry as described above, namely substantially anhydrous HF and an organic primer to produce the illustrated selective etch of FIG. 9.

The above described preferred embodiment facilitates preservation of deposited oxide thickness and minimizing or avoiding keyhole formation in shallow trench isolation when stripping thermal oxide from the active device regions. Ultraviolet light is preferably not used in the process.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method comprising:

providing a substrate having outwardly exposed grown oxide material and having deposited oxide material; and etching the grown oxide material substantially selective relative to the deposited oxide material using a substantially anhydrous HF comprising chemistry.

2. The method of claim 1 wherein the deposited oxide material is not outwardly exposed immediately prior to commencing said etching of the grown oxide material.

3. The method of claim 1 wherein the deposited oxide material is also outwardly exposed at commencing of said etching of the grown oxide material.

4. The method of claim 1 wherein the chemistry during etching comprises vapor HF, and the etching is conducted at a temperature ranging from about 60° C. to about 150° C.

5. The method of claim 1 wherein the chemistry during etching comprises vapor HF, and the etching is conducted at a pressure ranging from about 10 Torr to about 300 Torr.

6. The method of claim 1 wherein the chemistry during etching comprises vapor HF, and the etching is conducted at a temperature ranging from about 60° C. to about 150° C. and at a pressure ranging from about 10 Torr to about 300 Torr.

7. The method of claim 1 comprising providing the deposited oxide by plasma enhanced decomposition of tetraethylorthosilicate to form silicon dioxide.

8. The method of claim 1 wherein both of the grown and deposited oxides are substantially undoped.

9. A semiconductor processing method comprising:

thermally oxidizing a silicon surface to form substantially undoped silicon dioxide over a substrate;

chemical vapor depositing a substantially undoped silicon dioxide layer over the substrate, at least some of the thermally grown silicon dioxide being outwardly exposed; and vapor etching the exposed thermally grown silicon dioxide layer substantially selective relative to the deposited silicon dioxide layer using an etch chemistry comprising substantially anhydrous HF and an organic primer.

10. The method of claim 9 wherein the anhydrous HF has less than or equal to 0.1% water by volume.

11. The method of claim 9 wherein the chemical vapor depositing comprises plasma enhanced decomposition of tetraethylorthosilicate.

12. The method of claim 9 wherein the deposited silicon dioxide is not outwardly exposed immediately prior to commencing said vapor etching of the thermal silicon dioxide.

13. The method of claim 9 wherein the deposited silicon dioxide is also outwardly exposed at commencing of said vapor etching of the thermal silicon dioxide.

14. The method of claim 9 wherein the vapor etching is conducted at a temperature ranging from about 60° C. to about 150° C.

15. The method of claim 9 wherein the vapor etching is conducted at a pressure ranging from about 10 Torr to about 300 Torr.

16. The method of claim 9 wherein the vapor etching is conducted at a temperature ranging from about 60° C. to about 150° C. and at a pressure ranging from about 10 Torr to about 300 Torr.

17. The method of claim 9 wherein the organic primer is selected from the group consisting of alcohols and ketones and mixtures thereof.

18. A method of preparing a semiconductor substrate for fabrication of integrated circuitry comprising:

forming a circuitry isolation trench within a semiconductor substrate;

depositing electrically insulative oxide over the substrate and within the trench;

removing deposited oxide from outwardly of the trench;

providing a thermally grown oxide layer over the substrate outwardly of the trench, and providing outwardly exposed deposited oxide and outwardly exposed thermally grown oxide; and etching the exposed thermally grown oxide substantially selective relative to the exposed deposited oxide using a substantially anhydrous HF comprising chemistry.

19. The method of claim 18 wherein the thermally grown oxide is provided before the depositing.

20. The method of claim 18 wherein the thermally grown oxide is provided before forming the circuitry isolation trench.

21. The method of claim 18 wherein the chemistry during etching comprises vapor HF, and the etching is conducted at a temperature ranging from about 60° C. to about 150° C.

22. The method of claim 18 wherein the chemistry during etching comprises vapor HF, and the etching is conducted at a pressure ranging from about 10 Torr to about 300 Torr.

23. The method of claim 18 wherein the chemistry during etching comprises vapor HF, and the etching is conducted at a temperature ranging from about 60° C. to about 150° C. and at a pressure ranging from about 10 Torr to about 300 Torr.

24. The method of claim 18 wherein both of the grown and deposited oxides are substantially undoped.

25. A method of preparing a silicon wafer for fabrication of integrated circuitry comprising:

thermally growing a silicon dioxide layer over a bulk silicon wafer;

forming a silicon nitride layer over the thermal silicon dioxide layer;

forming a series of circuitry isolation trenches through the silicon nitride and thermal silicon dioxide and within the bulk silicon wafer;

chemical vapor depositing an electrically insulative substantially undoped silicon dioxide over the silicon wafer and within the trenches from decomposition of tetraethylorthosilicate;

planarize polishing the deposited substantially undoped silicon dioxide substantially selective relative to the silicon nitride layer;

etching the silicon nitride layer substantially selective relative to the thermal silicon dioxide and the deposited silicon dioxide leaving outwardly exposed substantially undoped deposited silicon dioxide and outwardly exposed thermal silicon dioxide; and vapor etching the exposed thermal silicon dioxide substantially selective relative to both the exposed deposited substantially undoped silicon dioxide and silicon using an etch chemistry comprising substantially anhydrous HF and an organic primer at a temperature of greater than or equal to about 50° C. and at subatmospheric pressure to form an outer wafer surface comprising silicon and deposited silicon dioxide isolated within the series of trenches.

26. The method of claim 25 wherein the chemical vapor depositing comprises plasma enhanced decomposition of tetraethylorthosilicate.

27. The method of claim 25 wherein the substantially anhydrous HF has less than or equal to 0.1% water by volume.

28. The method of claim 25 wherein the organic primer is selected from the group consisting of alcohols and ketones and mixtures thereof.

29. The method of claim 25 wherein the vapor etching is conducted at a pressure ranging from about 10 Torr to about 300 Torr.

30. The method of claim 25 wherein the thermal silicon dioxide is substantially undoped.

31. The method of claim 1 wherein the chemistry comprises an organic primer.

32. The method of claim 31 wherein the organic primer comprises an alcohol.

33. The method of claim 31 wherein the organic primer comprises a ketone.

34. The method of claim 9 wherein the organic primer comprises an alcohol.

35. The method of claim 9 wherein the organic primer comprises a ketone.

36. The method of claim 18 wherein the chemistry comprises an organic primer.

37. The method of claim 18 wherein the organic primer comprises an alcohol.

38. The method of claim 18 wherein the organic primer comprises a ketone.

39. The method of claim 25 wherein the organic primer comprises an alcohol.

40. The method of claim 25 wherein the organic primer comprises a ketone.

41. The method of claim 1 wherein the chemistry during etching comprises vapor HF and an organic primer, and the etching is conducted at a temperature ranging from about 60° C. to about 150° C. and at a pressure ranging from about 10 Torr to about 300 Torr.

42. The method of claim 41 wherein the organic primer comprises a ketone.

43. The method of claim 41 wherein the organic primer comprises an alcohol.

* * * * *

UNITED STATES PATENT AND TRADEMARK OFFICE
CERTIFICATE OF CORRECTION

PATENT NO. : 6,090,683  
DATED : July 18, 2000  
INVENTOR(S) : Torek

Page 1 of 1

It is certified that error appears in the above-identified patent and that said Letters Patent is hereby corrected as shown below:

Column 2,
Line 19, please delete "8" and replace it with -- 7 --.

Signed and Sealed this

Thirty-first Day of July, 2001

*Attest:*

*Nicholas P. Godici*

*Attesting Officer*

NICHOLAS P. GODICI
*Acting Director of the United States Patent and Trademark Office*